(12) United States Patent
Vakilinia et al.

(10) Patent No.: US 9,748,974 B2
(45) Date of Patent: *Aug. 29, 2017

(54) NON-BINARY LDPC DECODER USING BINARY SUBGROUP PROCESSING

(71) Applicant: Western Digital Technologies, Inc., Irvine, CA (US)

(72) Inventors: Kasra Vakilinia, Los Angeles, CA (US); Majid Nemati Anaraki, Irvine, CA (US); Anantha Raman Krishnan, Irvine, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 51 days.

This patent is subject to a terminal disclaimer.

(21) Appl. No.: 15/150,340

(22) Filed: May 9, 2016

(65) Prior Publication Data

US 2016/0329910 A1      Nov. 10, 2016

Related U.S. Application Data

(63) Continuation of application No. 14/231,511, filed on Mar. 31, 2014, now Pat. No. 9,337,864.

(Continued)

(51) Int. Cl.
*H03M 13/11* (2006.01)
*G06F 11/10* (2006.01)
*H03M 13/00* (2006.01)

(52) U.S. Cl.
CPC ......... *H03M 13/1131* (2013.01); *G06F 11/10* (2013.01); *H03M 13/112* (2013.01);

(Continued)

(58) Field of Classification Search
CPC ...................................................... H03M 13/11

(Continued)

(56) References Cited

U.S. PATENT DOCUMENTS 6,856,556 B1    2/2005   Hajeck
7,126,857 B2   10/2006   Hajeck (Continued)

OTHER PUBLICATIONS

DeClercq, et al., "Decoding Algorithms for Nonbinary LDPC Codes Over GF(q)," Communications, IEEE Transactions on, vol. 55, No. 4, pp. 633,643, Apr. 2007.

(Continued)

*Primary Examiner* — Fritz Alphonse
(74) *Attorney, Agent, or Firm* — McDermott Will & Emery LLP (57) ABSTRACT

In one embodiment, an electronic system includes a decoder configured to decode an encoded data unit using multiple variable nodes and multiple check nodes to perform a low-density parity check (LDPC) decoding process. The encoded data unit can be received from a solid-state memory array. As part of performing the LDPC decoding process, the decoder can (i) convert reliability information representing first non-binary values to reliability information representing first binary values, (ii) determine reliability information representing second binary values using the reliability information representing first binary values, and (iii) convert the reliability information representing the second binary values to reliability information representing second non-binary values.

20 Claims, 8 Drawing Sheets

Related U.S. Application Data (60) Provisional application No. 61/933,147, filed on Jan. 29, 2014.

(52) U.S. Cl.
CPC ..... *H03M 13/1171* (2013.01); *H03M 13/616* (2013.01); *H03M 13/658* (2013.01); *H03M 13/6583* (2013.01)

(58) Field of Classification Search
USPC ................ 714/758, 759, 773, 774, 779, 801
See application file for complete search history.

(56) References Cited

U.S. PATENT DOCUMENTS

| | | | |
|---|---|---|---|
| 7,190,681 B1* | 3/2007 | Wu | H04L 12/5601 370/316 |
| 7,430,136 B2 | 9/2008 | Merry, Jr. et al. | |
| 7,447,807 B1 | 11/2008 | Merry et al. | |
| 7,502,256 B2 | 3/2009 | Merry, Jr. et al. | |
| 7,509,441 B1 | 3/2009 | Merry et al. | |
| 7,596,643 B2 | 9/2009 | Merry, Jr. et al. | |
| 7,653,778 B2 | 1/2010 | Merry, Jr. et al. | |
| 7,685,337 B2 | 3/2010 | Merry, Jr. et al. | |
| 7,685,338 B2 | 3/2010 | Merry, Jr. et al. | |
| 7,685,374 B2 | 3/2010 | Diggs et al. | |
| 7,733,712 B1 | 6/2010 | Walston et al. | |
| 7,765,373 B1 | 7/2010 | Merry et al. | |
| 7,898,855 B2 | 3/2011 | Merry, Jr. et al. | |
| 7,912,991 B1 | 3/2011 | Merry et al. | |
| 7,936,603 B2 | 5/2011 | Merry, Jr. et al. | |
| 7,962,792 B2 | 6/2011 | Diggs et al. | |
| 8,078,918 B2 | 12/2011 | Diggs et al. | |
| 8,090,899 B1 | 1/2012 | Syu | |
| 8,095,851 B2 | 1/2012 | Diggs et al. | |
| 8,108,692 B1 | 1/2012 | Merry et al. | |
| 8,122,185 B2 | 2/2012 | Merry, Jr. et al. | |
| 8,127,048 B1 | 2/2012 | Merry et al. | |
| 8,135,903 B1 | 3/2012 | Kan | |
| 8,151,020 B2 | 4/2012 | Merry, Jr. et al. | |
| 8,161,227 B1 | 4/2012 | Diggs et al. | |
| 8,166,245 B2 | 4/2012 | Diggs et al. | |
| 8,243,525 B1 | 8/2012 | Kan | |
| 8,254,172 B1 | 8/2012 | Kan | |
| 8,261,012 B2 | 9/2012 | Kan | |
| 8,296,625 B2 | 10/2012 | Diggs et al. | |
| 8,312,207 B2 | 11/2012 | Merry, Jr. et al. | |
| 8,316,176 B1 | 11/2012 | Phan et al. | |
| 8,341,339 B1 | 12/2012 | Boyle et al. | |
| 8,375,151 B1 | 2/2013 | Kan | |
| 8,392,635 B2 | 3/2013 | Booth et al. | |
| 8,397,107 B1 | 3/2013 | Syu et al. | |
| 8,407,449 B1 | 3/2013 | Colon et al. | |
| 8,423,722 B1 | 4/2013 | Deforest et al. | |
| 8,433,858 B1 | 4/2013 | Diggs et al. | |
| 8,443,167 B1 | 5/2013 | Fallone et al. | |
| 8,447,920 B1 | 5/2013 | Syu | |
| 8,458,435 B1 | 6/2013 | Rainey, III et al. | |
| 8,458,556 B2 | 6/2013 | Planjery et al. | |
| 8,478,930 B1 | 7/2013 | Syu | |
| 8,489,854 B1 | 7/2013 | Colon et al. | |
| 8,503,237 B1 | 8/2013 | Horn | |
| 8,521,972 B1 | 8/2013 | Boyle et al. | |
| 8,549,236 B2 | 10/2013 | Diggs et al. | |
| 8,559,540 B2 | 10/2013 | Sun et al. | |
| 8,583,835 B1 | 11/2013 | Kan | |
| 8,601,311 B2 | 12/2013 | Horn | |
| 8,601,313 B1 | 12/2013 | Horn | |
| 8,612,669 B1 | 12/2013 | Syu et al. | |
| 8,612,804 B1 | 12/2013 | Kang et al. | |
| 8,615,681 B2 | 12/2013 | Horn | |
| 8,638,602 B1 | 1/2014 | Horn | |
| 8,639,872 B1 | 1/2014 | Boyle et al. | |
| 8,683,113 B2 | 3/2014 | Abasto et al. | |
| 8,700,834 B2 | 4/2014 | Horn et al. | |
| 8,700,950 B1 | 4/2014 | Syu | |
| 8,700,951 B1 | 4/2014 | Call et al. | |
| 8,706,985 B1 | 4/2014 | Boyle et al. | |
| 8,707,104 B1 | 4/2014 | Jean | |
| 8,707,123 B2* | 4/2014 | Liu | G06F 5/015 714/752 |
| 8,713,066 B1 | 4/2014 | Lo et al. | |
| 8,713,357 B1 | 4/2014 | Jean et al. | |
| 8,719,531 B2 | 5/2014 | Strange et al. | |
| 8,724,422 B1 | 5/2014 | Agness et al. | |
| 8,725,931 B1 | 5/2014 | Kang | |
| 8,745,277 B2 | 6/2014 | Kan | |
| 8,751,728 B1 | 6/2014 | Syu et al. | |
| 8,769,190 B1 | 7/2014 | Syu et al. | |
| 8,769,232 B2 | 7/2014 | Suryabudi et al. | |
| 8,775,720 B1 | 7/2014 | Meyer et al. | |
| 8,782,327 B1 | 7/2014 | Kang et al. | |
| 8,788,778 B1 | 7/2014 | Boyle | |
| 8,788,779 B1 | 7/2014 | Horn | |
| 8,788,880 B1 | 7/2014 | Gosla et al. | |
| 8,792,594 B2* | 7/2014 | Vojcic | H04L 1/005 375/233 |
| 8,793,429 B1 | 7/2014 | Call et al. | |
| 8,935,598 B1 | 1/2015 | Norrie | |
| 8,984,365 B1 | 3/2015 | Norrie | |
| 8,990,661 B1 | 3/2015 | Micheloni et al. | |
| 9,191,256 B2* | 11/2015 | Vojcic | |
| 9,250,994 B1 | 2/2016 | Vakilinia et al. | |
| 9,337,864 B1* | 5/2016 | Vakilinia | G06F 11/10 |
| 2010/0174849 A1 | 7/2010 | Walston et al. | |
| 2010/0250793 A1 | 9/2010 | Syu | |
| 2011/0087946 A1 | 4/2011 | Planjery et al. | |
| 2011/0099323 A1 | 4/2011 | Syu | |
| 2011/0283049 A1 | 11/2011 | Kang et al. | |
| 2012/0260020 A1 | 10/2012 | Suryabudi et al. | |
| 2012/0278531 A1 | 11/2012 | Horn | |
| 2012/0284460 A1 | 11/2012 | Guda | |
| 2012/0324191 A1 | 12/2012 | Strange et al. | |
| 2013/0132638 A1 | 5/2013 | Horn et al. | |
| 2013/0145106 A1 | 6/2013 | Kan | |
| 2013/0290793 A1 | 10/2013 | Booth et al. | |
| 2014/0059405 A1 | 2/2014 | Syu et al. | |
| 2014/0101369 A1 | 4/2014 | Tomlin et al. | |
| 2014/0115427 A1 | 4/2014 | Lu | |
| 2014/0133220 A1 | 5/2014 | Danilak et al. | |
| 2014/0136753 A1 | 5/2014 | Tomlin et al. | |
| 2014/0149826 A1 | 5/2014 | Lu et al. | |
| 2014/0157078 A1 | 6/2014 | Danilak et al. | |
| 2014/0181432 A1 | 6/2014 | Horn | |
| 2014/0223255 A1 | 8/2014 | Lu et al. | |

OTHER PUBLICATIONS

DeClercq, et al., "Extended minSum algorithm for decoding LDPC codes over $GF(q)$", IEEE Int. Symp. Inf. Theory, 2005.
Song; et al., "Reduced-complexity decoding of Q-ary LDPC codes for magnetic recording," Magnetics, IEEE Transactions on , vol. 39, No. 2, pp. 1081,1087, Mar. 2003.
Savin, "Min-max decoding for non binary LDPC codes", IEEE Int. Symp. Inf. Theory, 2008.
Voicila, et al., "Low-complexity decoding for non-binary LDPC codes in high order fields," Communications, IEEE Transactions on , vol. 58, No. 5, pp. 1365,1375, May 2010.
Voicila, et al., "Low-Complexity, Low-Memory EMS Algorithm for Non-Binary LDPC Codes," Communications, 2007. ICC '07. IEEE International Conference on , vol., No., pp. 671,676, Jun. 24-28, 2007.
Wymeersch, et al., "Log-domain decoding of LDPC codes over GF(q)" , Proc. IEEE Int. Conf. Commun., pp. 772-776 2004.

\* cited by examiner

$[LLR_{00}^{(p_1)}, LLR_{01}^{(p_1)}, LLR_{10}^{(p_1)}, LLR_{11}^{(p_1)}]$

230A
$L_{01}^{(p_1)} = max^*(LLR_{00}^{(p_1)}, LLR_{01}^{(p_1)}) - max^*(LLR_{10}^{(p_1)}, LLR_{11}^{(p_1)})$
$L_{10}^{(p_1)} = max^*(LLR_{00}^{(p_1)}, LLR_{10}^{(p_1)}) - max^*(LLR_{01}^{(p_1)}, LLR_{11}^{(p_1)})$
$L_{11}^{(p_1)} = max^*(LLR_{00}^{(p_1)}, LLR_{11}^{(p_1)}) - max^*(LLR_{01}^{(p_1)}, LLR_{10}^{(p_1)})$ $[LLR_{00}^{(p_2)}, LLR_{01}^{(p_2)}, LLR_{10}^{(p_2)}, LLR_{11}^{(p_2)}]$ 230B
$L_{01}^{(p_2)} = max^*(LLR_{00}^{(p_2)}, LLR_{01}^{(p_2)}) - max^*(LLR_{10}^{(p_2)}, LLR_{11}^{(p_2)})$
$L_{10}^{(p_2)} = max^*(LLR_{00}^{(p_2)}, LLR_{10}^{(p_2)}) - max^*(LLR_{01}^{(p_2)}, LLR_{11}^{(p_2)})$
$L_{11}^{(p_2)} = max^*(LLR_{00}^{(p_2)}, LLR_{11}^{(p_2)}) - max^*(LLR_{01}^{(p_2)}, LLR_{10}^{(p_2)})$ $[LLR_{00}^{(p_3)}, LLR_{01}^{(p_3)}, LLR_{10}^{(p_3)}, LLR_{11}^{(p_3)}]$ 230C
$L_{01}^{(p_3)} = max^*(LLR_{00}^{(p_3)}, LLR_{01}^{(p_3)}) - max^*(LLR_{10}^{(p_3)}, LLR_{11}^{(p_3)})$
$L_{10}^{(p_3)} = max^*(LLR_{00}^{(p_3)}, LLR_{10}^{(p_3)}) - max^*(LLR_{01}^{(p_3)}, LLR_{11}^{(p_3)})$
$L_{11}^{(p_3)} = max^*(LLR_{00}^{(p_3)}, LLR_{11}^{(p_3)}) - max^*(LLR_{01}^{(p_3)}, LLR_{10}^{(p_3)})$ 240A
$L_{01}^{(c_1)} = 2atanh\left(\prod_j tanh\left(\frac{L_{01}^{(p_j)}}{2}\right)\right)$ 240B
$L_{10}^{(c_2)} = 2atanh\left(\prod_j tanh\left(\frac{L_{10}^{(p_j)}}{2}\right)\right)$ 240C
$L_{11}^{(c_3)} = 2atanh\left(\prod_j tanh\left(\frac{L_{11}^{(p_j)}}{2}\right)\right)$

| FIGURE 3A | FIGURE 3B |
| --- | --- |

NON-BINARY LDPC DECODER USING BINARY SUBGROUP PROCESSING

CROSS REFERENCE TO RELATED APPLICATIONS

The present application claims the benefit of priority under 35 U.S.C. §120 as a continuation of U.S. patent application Ser. No. 14/231,511 entitled "Non-Binary LDPC Decoder using Binary Subgroup Processing," filed on Mar. 31, 2014, which claims the benefit of priority under 35 U.S.C. §119 as a nonprovisional of U.S. Provisional Patent Application No. 61/933,147 entitled "Non-Binary LDPC Decoder using Binary Subgroup Processing," filed Jan. 29, 2014, the disclosures of which are hereby incorporated by reference in their entirety for all purposes.

BACKGROUND

Technical Field

This disclosure relates in part to data storage systems for computer systems. More particularly, the disclosure relates in part to a non-binary decoder using binary subgroup processing.

Description of the Related Art

Non-volatile memory arrays often have limited endurance. The endurance of the memory array is typically contingent on usage pattern and wear. In addition, the endurance depends on a type of the non-volatile memory array used. For example, memory arrays with multi-level cell (MLC) NAND media typically have a lower endurance than memory arrays with single-level cell (SLC) NAND media. To protect user data stored to memory arrays from corruption, which may be caused by a diminished endurance, user data can be encoded, for example, by generating parity data that can be stored along with user data to facilitate error detection and correction. However, decoding of encoded data can be time consuming and resource intensive. Accordingly, it is desirable to provide more efficient mechanisms for decoding data.

BRIEF DESCRIPTION OF THE DRAWINGS

Systems and methods disclosed herein will now be described with reference to the following drawings, in which.

DETAILED DESCRIPTION

While certain embodiments are described, these embodiments are presented by way of example only, and are not intended to limit the scope of protection. Indeed, the novel methods and systems described herein may be embodied in a variety of other forms. Furthermore, various omissions, substitutions, and changes in the form of the methods and systems described herein may be made without departing from the scope of protection.

Overview

Data storage systems, such as solid state drives, typically include one or more controllers coupled with one or more non-volatile memory arrays. Depending on the type of non-volatile memory array used, stored data may be subject to corruption as a result of, for example, read/write disturbs, loss of data retention, and/or loss of endurance. Data storage systems can utilize one or more error correction or error coding mechanisms to detect and/or correct errors in the stored data. One such mechanism can determine parity data when writing user data. Parity data can be stored, for example, in a memory array. When stored user data is retrieved, parity data can be utilized as part of a decoding process to determine the integrity of the retrieved user data. If one or more errors are detected, such errors may be corrected.

One type of error correct on or error coding mechanism that can be used by data storage systems to code data is low-density parity-check (LDPC)codes. To manage LDPC coding, the data storage systems can include decoder and encoder modules that utilize the LDPC codes for decoding and generating parity data, respectively. The LDPC codes can be decoded using a decoding matrix H and generated using a corresponding generating matrix G. The decoding process performed by the decoder modules, in particular, can involve an iterative decoding process where values (for example, probabilities or likelihoods of belief) are passed between variable nodes and check nodes to decode data.

Data storage systems can implement LDPC coding to enable processing of binary and/or non-binary LDPC codes. In some embodiments, whether the data storage systems may decode or encode data using a binary LDPC code or non-binary LDPC code can, for example, depend on a number of memory states for a storage medium in which the data storage systems can store and retrieve data, whether multiple memory cells are grouped into a memory element, etc. For example, a data storage system can use binary LDPC codes for storing or retrieving data from one or more storage mediums including memory elements that store single bits of information, such as SLC NAND media which may store in a memory cell one of "0" and "1" values, and use non-binary LDPC codes for storing or retrieving data from one or more storage mediums including memory elements that store multiple bits of information, such as MLC NAND media or SLC NAND media in which two or more memory cells are grouped into a single memory element. For instance, two-level or two-bit MLC NAND can store in a memory cell one of "00," "01," "10," and "11" values.

Embodiments of the present disclosure are directed in part to a LDPC decoder module that can decompose a non-binary decoding process into binary decoding processes. In one embodiment, the decomposition of the non-binary decoding processes into the binary decoding processes can enable the LDPC decoder module to arrive at the same decoding results as if the LDPC decoder module directly performed the decoding using the non-binary decoding process. In another embodiment, the decomposition of the non-binary decoding processes into the binary decoding processes can enable the LDPC decoder module to utilize simplifications or approximations to increase the speed at which the LDPC decoder module reaches decoding results. In yet another embodiment, the LDPC decoder module can utilize simplifications or approximations in the decoding process to remove logarithmic or exponential operations, reducing memory usage and implementation complexity for the LDPC decoder module. Advantageously, in certain embodiments, the decomposition of the non-binary decoding processes into the binary decoding processes can enable the LDPC decoder module perform the decoding process without evaluating numerous combinations of values to determine minimum values as may be done in some non-binary decoding processes, like in particular extended minimum-sum algorithms.

System Overview

Figure 1A:
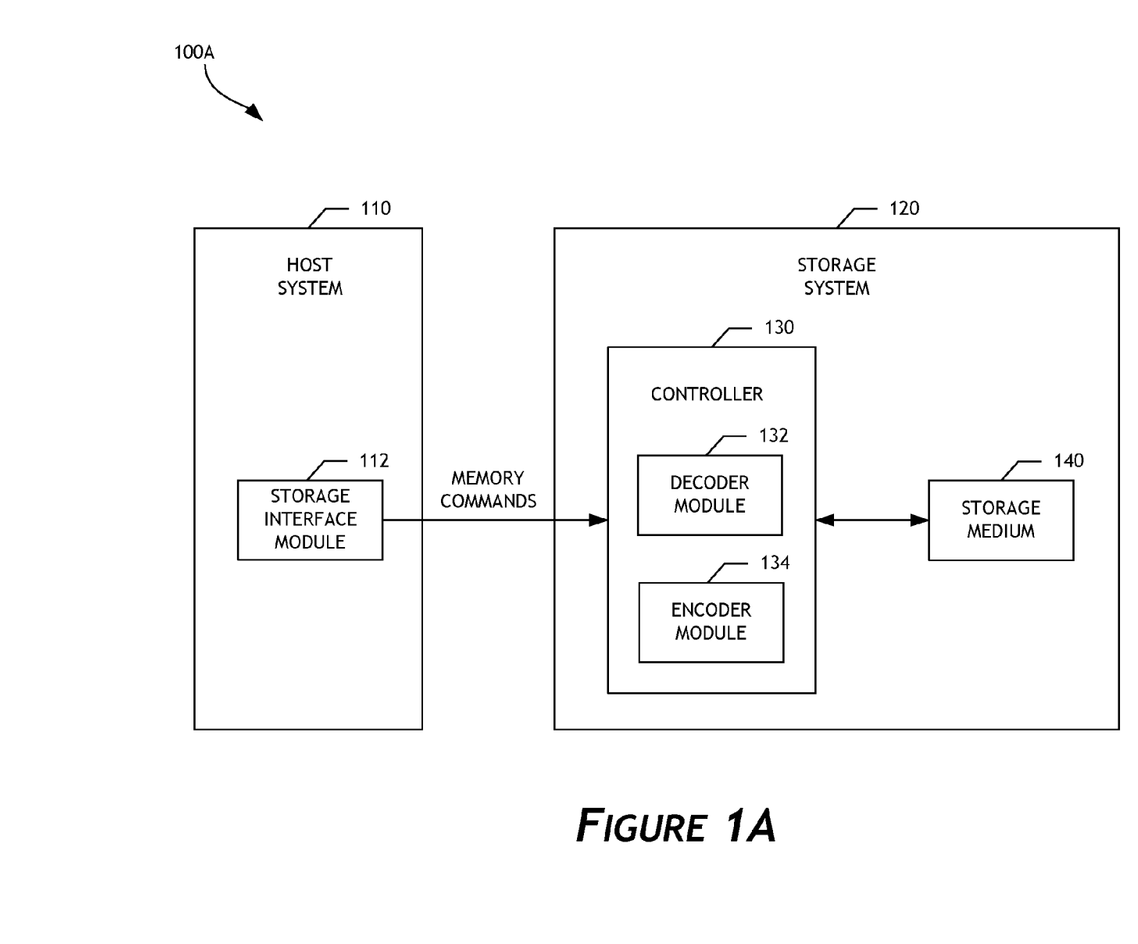
FIG. 1A illustrates a combination of a host system and a data storage system that implements a non-binary decoder using binary subgroup processing according to one embodiment of the invention.

FIG. 1 illustrates a combination 100A of a host system 110 and a data storage system 120 that implements a non-binary decoder using binary subgroup processing. As is shown, the data storage system 120 (e.g., hybrid hard drive, solid state drive, etc.) includes a controller 130 and a storage medium 140. The storage medium 140 may comprise an array of non-volatile memory, such as flash integrated circuits, Chalcogenide RAM (C-RAM), Phase Change Memory (PC-RAM or PRAM), Programmable Metallization Cell (PMC-RAM or PMCm), Ovonic Unified Memory (OUM), Resistance RAM (RRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRAM), other discrete NVM (non-volatile memory) chips, or any combination thereof. Non-volatile memory can be arranged in blocks having one or more pages, which comprise one or more memory cells. In sonic embodiments, the data storage system 120 can further comprise other types of storage, such as one or more magnetic media storage modules or other types of storage modules.

The controller 130 can be configured to receive data and/or storage access commands from a storage interface module 112 (e.g., a device driver) of the host system 110. Storage access commands communicated by the storage interface module 112 can include write data and read data commands issued by the host system 110. Read and write commands can specify a logical address (e.g., logical block addresses or LBAs) used to access the data storage system 120. The controller 130 can execute the received commands in the storage medium 140.

Data storage system 120 can store data communicated by the host system 110. In other words, the data storage system 120 can act as memory storage for the host system 110. To facilitate this function, the controller 130 can implement a logical interface. The logical interface can present to the host system 110 data storage system memory as a set of logical addresses e.g., contiguous address) where user data can be stored. Internally, the controller 130 can map logical addresses to various physical locations or addresses in the storage medium 140 and/or other storage modules.

The controller 130 includes a decoder module 132 and an encoder module 134 configured to decode and encode data, respectively, stored in and retrieved from the storage medium 140. The encoder module 134 can encode stored data so as to, for example, protect the data from potential errors encountered during retrieval of stored data. The decoder module 132 can further perform error detection to determine the integrity of data retrieved from the storage medium 140 and perform, if necessary, error correction of retrieved data. In some embodiments, when the storage medium 140 comprises NAND memory that may be early in the lifecycle and thus have relatively higher retention and/or endurance, the controller 130 can direct the encoder module 134 to encode data using a relatively higher coding rate so that less parity data is used. As the storage medium 140 wears out over time, the controller 130 can direct the encoder module 134 to switch to lower encoding rates such that more parity data is generated to protect stored user data from errors. The controller 130 can store the coding rates for encoded data in the storage medium 140 or another storage module (not shown) so that the decoder module 132 can later access the information to decode the encoded data. In some embodiments, the decoder module 132 and the encoder module 134 can respectively decode LDPC coded data and encode data using LDPC codes.

Figure 1B:
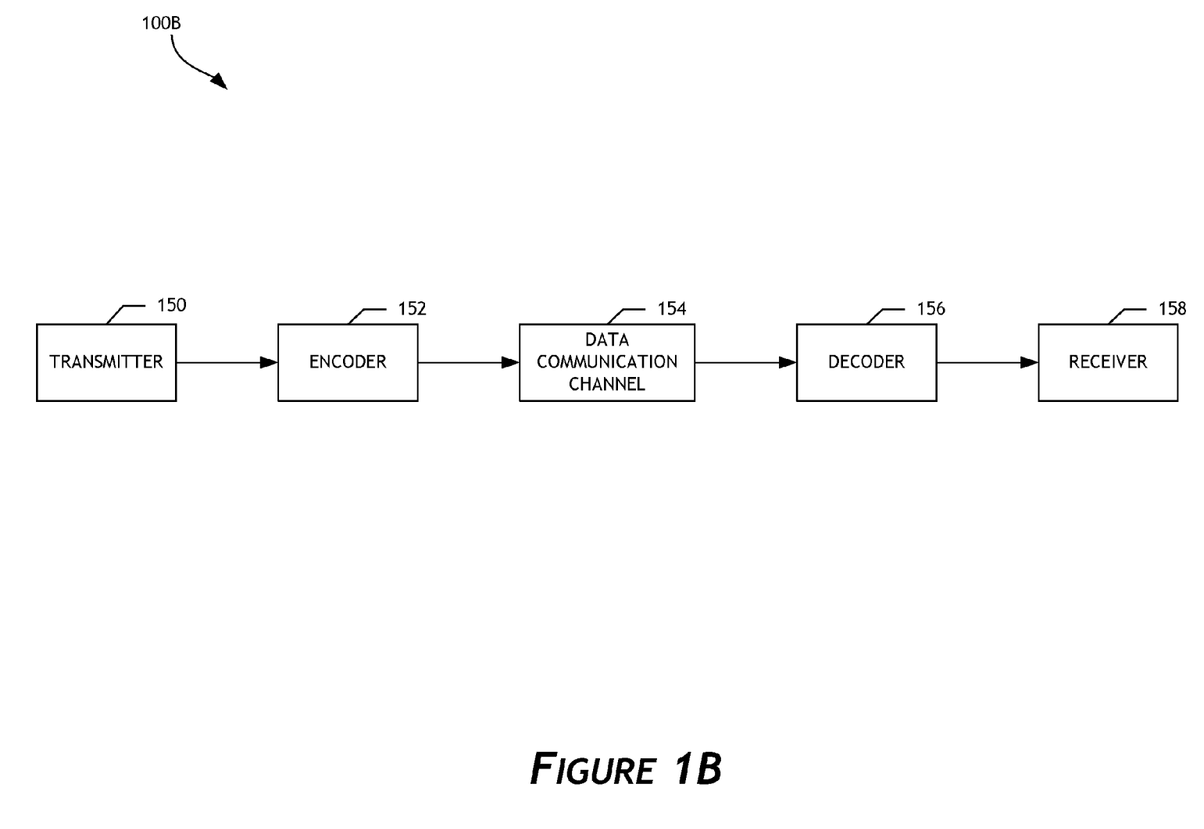
FIG. 1B illustrates a data transmission system according to one embodiment of the invention.

FIG. 1B illustrates a data transmission system 100B according to one embodiment. In the data transmission system 100B, a transmitter 150 can send or transmit data to a receiver 158 over a data communication channel 154. The transmitted data can be encoded by an encoder 152 before the data is transmitted over the data communication channel 154. The data communication channel 154 can be any suitable wired and/or wireless connection, such as a satellite channel, 802.11 wireless channel, Ethernet channel, Bluetooth channel, connection between semiconductor components or devices, data storage device (e.g., magnetic, solid-state, or the like), and so on. The data transmitted over the data communication channel 154 can be decoded by a decoder 156. The decoded data can then be provided to the receiver 158.

LDPC Decoder

In some embodiments, the decoder module 132 can decode data that may have been encoded using anon-binary LDPC coding. The decoder module 132 can read retrieved data from the storage medium 140 and calculate log likelihood ratio (LLR) values (for example, vectors of LLR values) for one or more read channels based on the data. The decoder module 132 can then iteratively transfer LLR values between variable nodes and check nodes using one or more LDPC coding techniques to decode the data. The decoding process can iterate on average from 3 to 4 iterations and may complete after a predetermined maximum number of iterations, such as 20 iterations.

Figure 2:
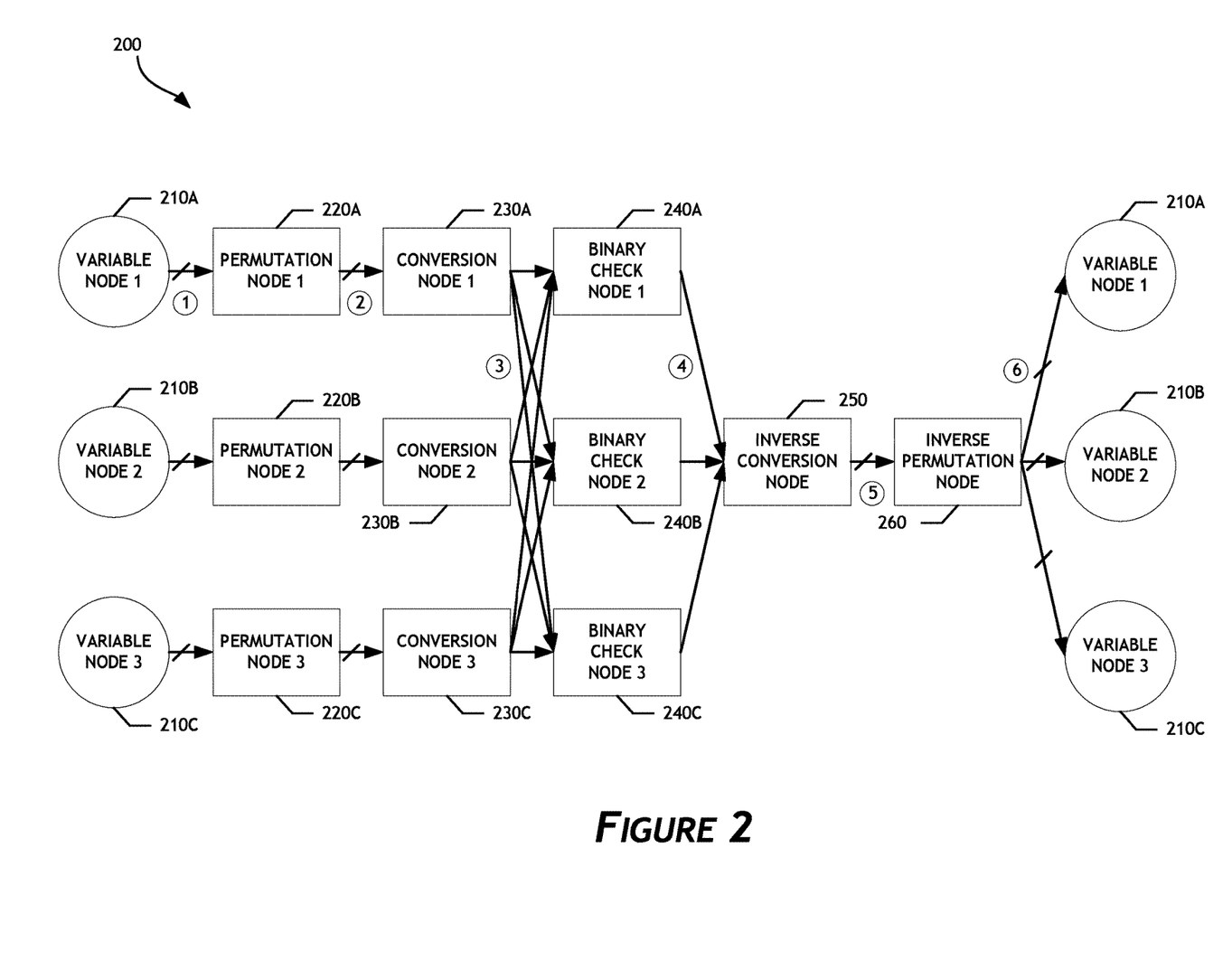
FIG. 2 illustrates a flow diagram depicting a decoding process by a decoder according to one embodiment of the invention.

FIG. 2 illustrates a flow diagram 200 depicting a LDPC decoding process by a decoder, such as the decoder module 132 or the decoder 156. The flow diagram 200 illustrates the transfer of values from variable nodes 210A, 210B, 210C to binary check nodes 240A, 240B, 240C and back to the same variable nodes 210A, 210B, 210C. Conversion nodes 230A, 230B, 230C can facilitate the conversion of non-binary values from the variable nodes 210A, 210B, 210C to binary values for processing by the binary check nodes 240A, 240B, 240C. Inverse conversion node 250 can facilitate the conversion of binary values from the binary check nodes 240A, 240B, 240C to non-binary values for processing by the variable nodes 210A, 210B, 210C. The conversion nodes 230A, 230B, 230C, the binary check nodes 240A, 240B, 240C, and the inverse conversion node 250 can advantageously together operate as if to form a non-binary check node in certain embodiments. State transitions are represented by circled numbers in the flow diagram 200.

The example of flow diagram 200 demonstrates the decomposition of non-binary values for a Galois field of size four (i.e., GF(4)) at the variable nodes 210A, 210B, 210C. This example, however, is intended to be illustrative and approaches disclosed herein can further extend to a Galois field having any other size less than or greater than four (for example, a Galois field of size eight or sixteen At state transition 1, the variable nodes 210A, 210B, 210C can each output a vector including four values to a respective one of permutation nodes 220A, 220B, 220C. The permutation nodes 220A, 220B, 220C can permute the received vectors including the four LLR values using a corresponding element of a decoding matrix At state transition 2, the permutation nodes 220A, 220B, 220C can output the permuted vectors to a respective one of the conversion nodes 230A, 230B, 230C. The permuted vectors can have the form of $[LLR_{00}^{(pj)}, LLR_{01}^{(pj)}, LLR_{10}^{(pj)}, LLR_{11}^{(pj)}]$, where j can correspond to the number of a particular node of the permutation nodes 220A, 220B, 220C that outputs the vector, and $LLR_{00}^{(pj)}, LLR_{01}^{(pj)}, LLR_{10}^{(pj)}, LLR_{11}^{(pj)}$ can correspond to the four LLR values of the permuted vector.

The conversion nodes 230A, 230B, 230C can convert the permuted vectors in accordance with a decomposition algorithm to form binary inputs for the binary check nodes 240A, 240B, 240C. For example, each of the conversion nodes 230A, 230B, 230C can convert the permuted vectors according to Equations (1), (2), and (3).

$$L_{01}^{(pj)} = \max^*(LLR_{00}^{(pj)}, LLR_{01}^{(pj)}) - \max^*(LLR_{10}^{(pj)}, LLR_{11}^{(pj)}) \qquad (1)$$

$$L_{10}^{(pj)} = \max^*(LLR_{00}^{(pj)}, LLR_{10}^{(pj)}) - \max^*(LLR_{01}^{(pj)}, LLR_{11}^{(pj)}) \qquad (2)$$

$$L_{11}^{(pj)} = \max^*(LLR_{00}^{(pj)}, LLR_{11}^{(pj)}) - \max^*(LLR_{01}^{(pj)}, LLR_{10}^{(pj)}) \qquad (3)$$

where $\max^*(a,b) = \max(a,b) + \log(1 + e^{-|a-b|})$; $L_{01}^{(pj)}$ can correspond to the combined message from the subgroup {00, 01} and the binary value output from each of the conversion nodes 230A, 230B, 230C to the binary check node 240A; $L_{10}^{(pj)}$ can correspond to the combined message from the subgroup {00,10} and the binary value output from each of the conversion nodes 230A, 230B, 230C to the binary check node 240B; $L_{11}^{(pj)}$ can correspond to the combined message from the subgroup {00,11} and the binary value output from each of the conversion nodes 230A, 230B, 230C to the binary check node 240C. It can be noted that Gs={{00,01}, {00,01}, {00,11}} and that {00,01}, {00,10}, and {00,11} can be the subgroups having a size of two in GF(4).

In some embodiments, the computation for max*(a,b) can be performed using one or more simplifications or approximations. For instance, the computation can be performed using a lookup table or an approximation $\max^*(a,b) \approx \gamma \cdot \max(a,b)$ in place of performing the logarithmic or exponential operations that may otherwise be performed. The value for γ can be selected based on a code rate for the encoded data and set at manufacture of the data storage system 120. The value for γ can be a real number such as 0.75 in one implementation, or more or less in other implementations (for example, such as 0.65, 0.80, 1.00). In certain embodiments, the value for γ may not be based on noise detected on one or more read channels at run-time.

At state transition 3, the conversion nodes 230A, 230B, 230C can each output three binary values for processing by the binary check nodes 240A, 240B, 240C. The binary check nodes 240A, 240B, 240C can then perform a binary check node algorithm to determine a value for output to the inverse conversion node 250. In one example, each of the binary check nodes 240A, 240B, 240C can perform the binary check node algorithm of Equation (4).

$$L_i^{(cm)} = 2 \operatorname{atanh}\left(\prod_j \tanh\left(\frac{L_i^{(pj)}}{2}\right)\right) \qquad (4)$$

where i can correspond to the subgroup for a given binary check node (such as 01, 10, and 11); $L_i^{(cm)}$ can correspond to the output value for the given binary check node; and m can correspond to the number of a particular node of the binary check nodes 240A, 240B, 240C that outputs the value. In particular, the binary check nodes 240A, 240B, 240C can respectively perform the binary check node algorithms of Equations (5), (6), and (7).

$$L_{01}^{(c_1)} = 2 \operatorname{atanh}\left(\prod_j \tanh\left(\frac{L_{01}^{(pj)}}{2}\right)\right) \qquad (5)$$

$$L_{10}^{(c_2)} = 2 \operatorname{atanh}\left(\prod_j \tanh\left(\frac{L_{10}^{(pj)}}{2}\right)\right) \qquad (6)$$

$$L_{11}^{(c_3)} = 2 \operatorname{atanh}\left(\prod_j \tanh\left(\frac{L_{11}^{(pj)}}{2}\right)\right) \qquad (7)$$

In another example, each of the binary check nodes 240A, 240B, 240C can perform the binary check node algorithm of Equation (8), which can reduce the memory usage and calculation complexity for performing the binary check node algorithm and enable faster processing and parallelization of performance of some processing by one or more of the conversion nodes 230A, 230B, 230C and the permutation nodes 220A, 220B, 220C.

$$L_i^{(cm)} = \alpha \cdot \left(\prod_j \operatorname{sign}\left(L_i^{(pj)}\right)\right) \cdot \min\left(\left|L_i^{(pj)}\right|\right) \qquad (8)$$

where i can correspond to the subgroup for a given binary check nodes (such as 01, 10, and 11); a can correspond to a configurable constant such as 0.75, or more or less depending on the implementation (for example, 0,65, 0.80, 1.00); $\operatorname{sign}(L_i^{(pj)})$ can correspond to the product of the signs of $L_i^{(p1)}, L_i^{(p2)}$, and $L_i^{(p3)}$; $\min(|L_i^{(pj)}|)$ can correspond to the minimum $L_i$ of $L_i^{(p1)}, L_i^{(p2)}$, and $L_i^{(p3)}$; $L_i^{(cm)}$ can correspond to the output value for a given binary check node; and m can correspond to the number of a given node of the binary check nodes 240A, 240B, 240C that outputs the value. In particular, the binary check nodes 240A, 240B, 240C can respectively perform the binary check node algorithms of Equations (9), (10), and (11).

$$L_{01}^{(c_1)} = \alpha \cdot \left(\prod_j \operatorname{sign}\left(L_{01}^{(pj)}\right)\right) \cdot \min\left(\left|L_{01}^{(pj)}\right|\right) \qquad (9)$$

$$L_{10}^{(c_2)} = \alpha \cdot \left(\prod_j \operatorname{sign}\left(L_{10}^{(pj)}\right)\right) \cdot \min\left(\left|L_{10}^{(pj)}\right|\right) \qquad (10)$$

$$L_{11}^{(c_3)} = \alpha \cdot \left(\prod_j \operatorname{sign}\left(L_{11}^{(pj)}\right)\right) \cdot \min\left(\left|L_{11}^{(pj)}\right|\right) \qquad (11)$$

At state transition 4, the binary check nodes 240A, 240B, 240C can output the determined values of $L_{01}^{(c_1)}, L_{10}^{(c_2)}$, and $L_{11}^{(c_3)}$ to the inverse conversion node 250. The inverse conversion node 250 can convert the determined values of $L_{01}^{(c_1)}, L_{10}^{(c_2)}$, and $L_{11}^{(c_3)}$ using an inverse of the decomposition so as to form non-binary inputs for the inverse permutation node 260. In one example, the inverse conversion node 250 can convert the determined values according to Equations (12), (13), (14), and (15).

$$S_{01} = \frac{e^{L_{01}^{(c_1)}}}{1+e^{L_{01}^{(c_1)}}} \quad (12)$$

$$S_{10} = \frac{e^{L_{10}^{(c_2)}}}{1+e^{L_{10}^{(c_2)}}} \quad (13)$$

$$S_{11} = \frac{e^{L_{11}^{(c_3)}}}{1+e^{L_{11}^{(c_3)}}} \quad (14)$$

$$[LLR_{00}^{(p)}, LLR_{01}^{(p)}, LLR_{10}^{(p)}, LLR_{11}^{(p)}] = \left[0, \log\left(\frac{S_{01}-S_{10}-S_{11}+1}{S_{01}+S_{10}+S_{11}-1}\right), \log\left(\frac{S_{10}-S_{01}-S_{11}+1}{S_{01}+S_{10}+S_{11}-1}\right), \log\left(\frac{S_{11}-S_{01}-S_{10}+1}{S_{01}+S_{10}+S_{11}-1}\right)\right] \quad (15)$$

where $S_{01}$, $S_{10}$, and $S_{11}$ can correspond to intermediate values used to determine the values for the vector $[LLR_{00}^{(p)}, LLR_{01}^{(p)}, LLR_{10}^{(p)}, LLR_{11}^{(p)}]$ output from the inverse conversion node 250.

In another example, the determined values of $L_{01}^{(c_1)}$, $L_{10}^{(c_2)}$, and $L_{11}^{(c_3)}$ can instead be sorted and compared with zero, and based on the result of the comparison, the values for the vector $[LLR_{00}^{(p)}, LLR_{01}^{(p)}, LLR_{11}^{(p)}]$ can be determined by using an approximation sort algorithm. The approximation sort algorithm can include assigning 0 to the largest element, the second largest of the determined values to the second largest element, the third largest of the determined values to the third largest element, and β times the sum of the second and third largest determined values to the fourth largest element. For instance, assuming $L_{01}^{(c_m)} < L_{10}^{(c_m)} < 0 < L_{11}^{(c)}$, the values for the vector $[LLR_{00}^{(p)}, LLR_{01}^{(p)}, LLR_{10}^{(p)}, LLR_{11}^{(p)}]$ can be determined according to Equation (16).

$$[LLR_{00}^{(p)}, LLR_{01}^{(p)}, LLR_{10}^{(p)}, LLR_{11}^{(p)}] = [-|L_{01}^{(c_m)}|, \beta(-|L_{11}^{(c_m)}|-|L_{01}^{(c_m)}|), -|L_{11}^{(c_m)}|, 0] \quad (16)$$

At state transition 5, the inverse conversion node 250 can output the determined vector $[LLR_{00}^{(p)}, LLR_{01}^{(p)}, LLR_{10}^{(p)}]$ to the inverse permutation node 260. The inverse permutation node 260 can inversely permute the determined vector $[LLR_{00}^{(p)}, LLR_{01}^{(p)}, LLR_{10}^{(p)}, LLR_{11}^{(p)}]$ using a corresponding element of the decoding matrix H before outputting the results of the inverse permutation to the variable nodes 210A, 210B, 210C at state transition 6. The variable nodes 210A, 210B, 210C can perform a summation of the received LLR values of the inversely permuted vectors and make a decision.

Figure 3A:
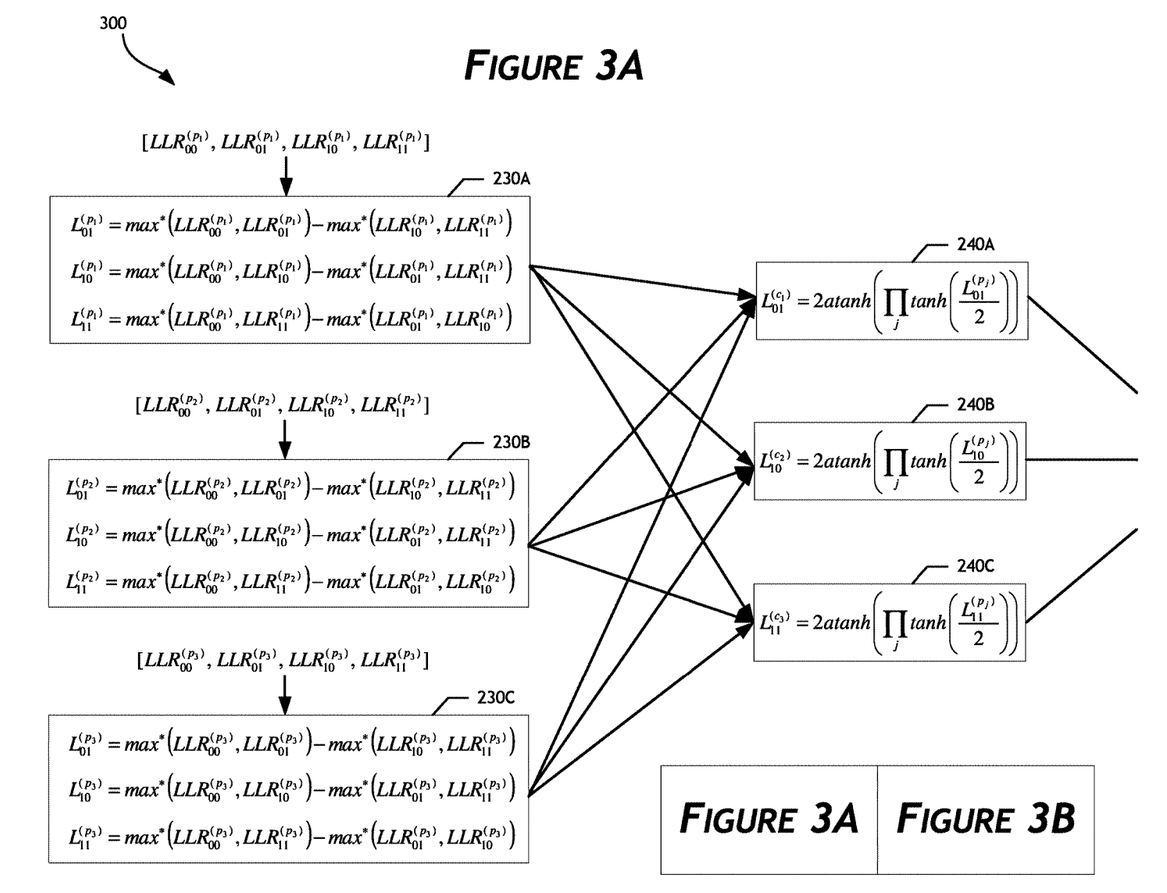
FIGS. 3A and 3B illustrate a flow diagram depicting algorithms and data transfers in a decoding process by a decoder according to one embodiment of the invention.
Figure 3B:
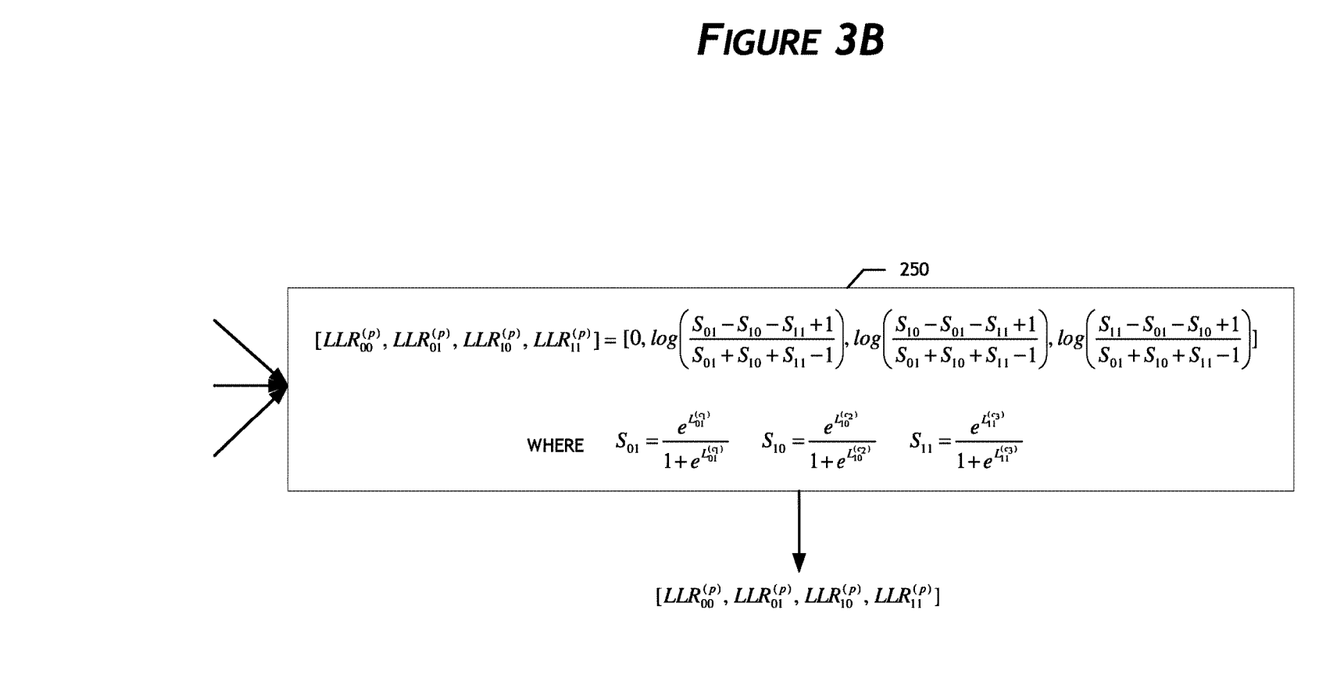

FIG. 3A and 3B illustrate a flow diagram 300 depicting algorithms and data transfers in a LDPC decoding process by a decoder, such as the decoder module 132 or the decoder 156. The flow diagram 300 can illustrate a first decoder implementation of algorithms and data transfers in the LDPC decoding process illustrated in the flow diagram 200. Advantageously, the flow diagram 300 provides algorithms for the conversion nodes 230A, 230B, 230C, the binary check nodes 240A, 240B, 240C, and the inverse conversion node 250 that can, in combination, enable the nodes to arrive at the same decoding results as if the nodes formed a non-binary check node.

In a second decoder implementation of algorithms and data transfers in the decoding process illustrated in the flow diagram 200, the decoder can implement the decoding process of the flow diagram 300, with the exception of using the approximation algorithms of Equations (9), (10), and (11) to respectively perform the check node updates at the binary check nodes 240A, 240B, 240C.

In a third decoder implementation of algorithms and data transfers in the LDPC decoding process illustrated in the flow diagram 200, the decoder can implement the decoding process of the flow diagram 300, with the exception of: (i) using the approximation algorithms of Equations (9), (10), and (11) to respectively perform the check node updates at the binary check nodes 240A, 240B, 240C, (ii) using the approximation algorithm of max*(a, b)≈γ·max(a, b) to solve for max*(a, b) at the conversion nodes 230A, 230B, 230C, and (iii) using an approximation sort algorithm, such as illustrated with respect to Equation (16), to solve for the values of the vector $[LLR_{00}^{(p)}, LLR_{01}^{(p)}, LLR_{10}^{(p)}, LLR_{11}^{(p)}]$ at the inverse conversion node 250.

Figure 4:
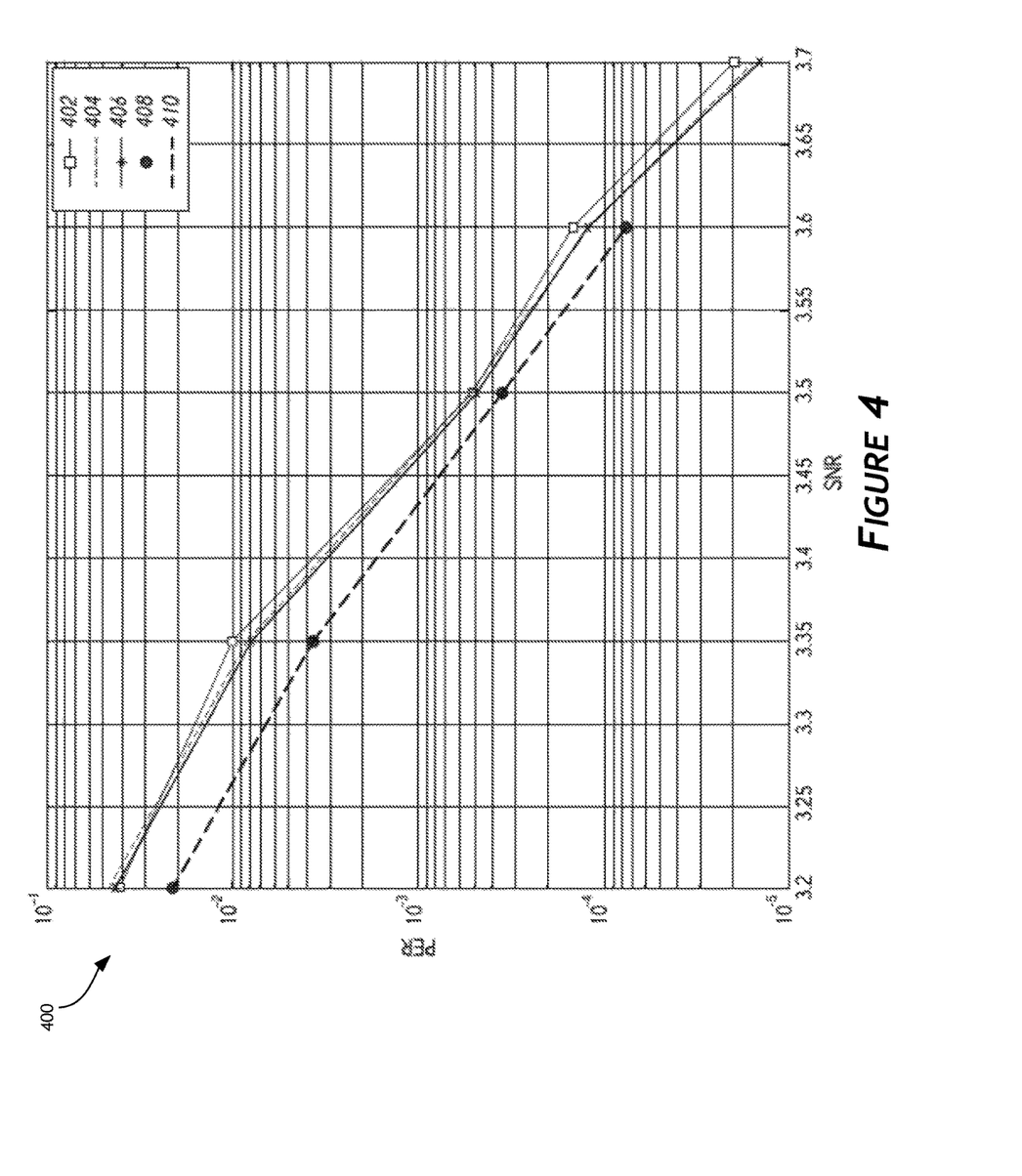
FIGS. 4 and 5 are graphs illustrating the signal-to-noise ratio for given page error rates for decoders according to embodiments of the invention.
Figure 5:
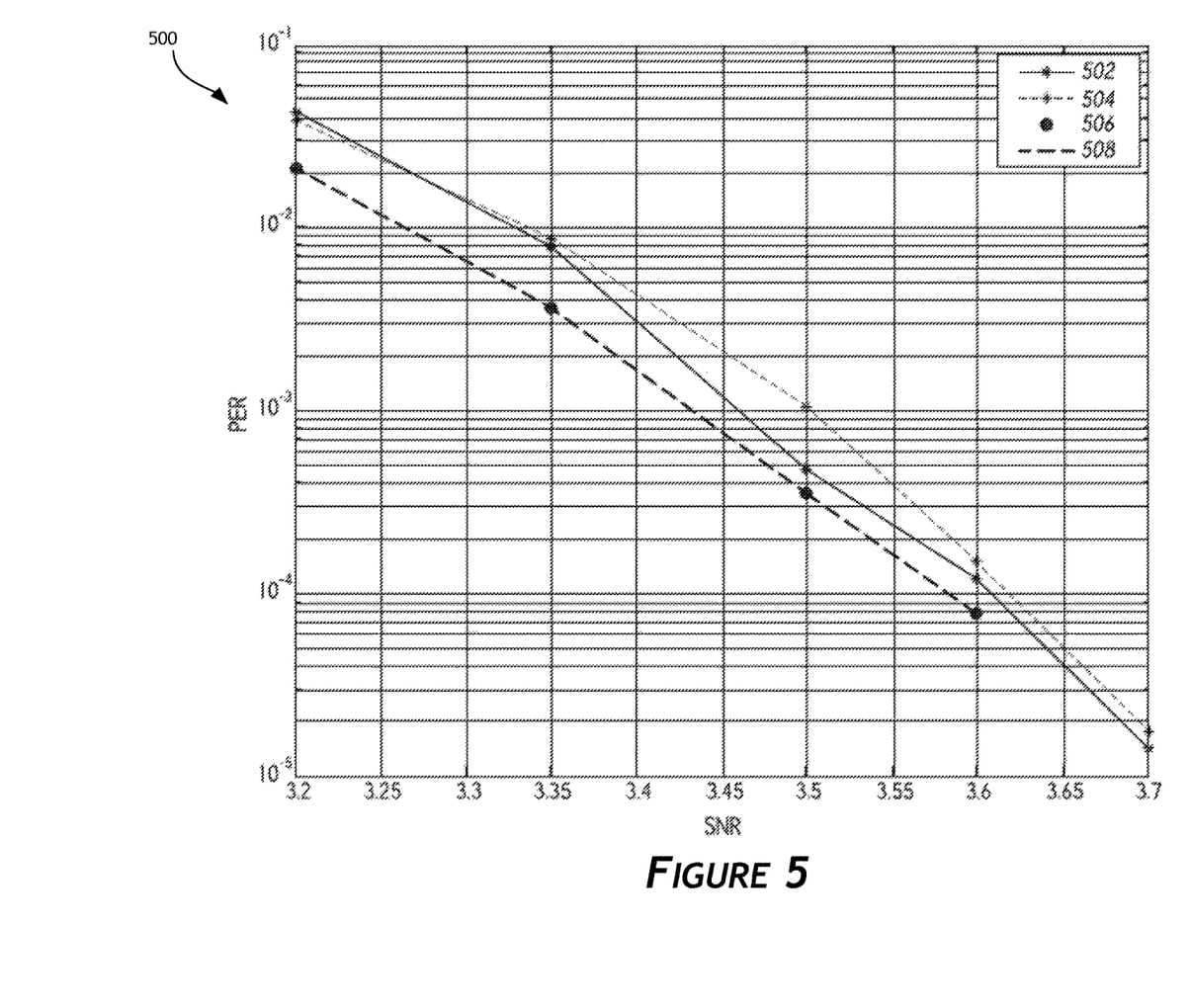

FIGS. 4 and 5 are graphs 400 and 500 illustrating signal-to-noise ratios for given page error rates for example decoders, such as the decoder module 132 or the decoder 156. Table 1 below provides a legend for relating the graph labels in the graph 400 and the corresponding decoder implementations described herein.

TABLE 1

| Graph Label | Disclosure Implementation |
| --- | --- |
| 410 | traditional non-binary LDPC decoder |
| 408 | first decoder implementation |
| 406 | second decoder implementation: α = 0.65 |
| 404 | second decoder implementation: α = 0.70 |
| 402 | second decoder implementation: α = 0.60 |

Table 2 below provides a legend for relating the graph labels in the graph 500 and the corresponding decoder implementations described herein.

TABLE 2

| Graph Label | Disclosure Implementation |
| --- | --- |
| 508 | traditional non-binary LDPC decoder |
| 506 | first decoder implementation |
| 504 | third decoder implementation: α = 0.75, β = 0.75, γ = 1.0 |
| 502 | second decoder implementation: α = 0.65 |

As can be seen from the graphs 400 and 500, the performance of the first decoder implementation can match the performance of the traditional non-binary LDPC decoder. In addition, the performance loss from using the second or third decoder implementations can be relatively small compared to using the traditional non-binary LDPC decoder and first decoder implementation, especially for relatively higher signal-to-noise ratios.

Figure 6:
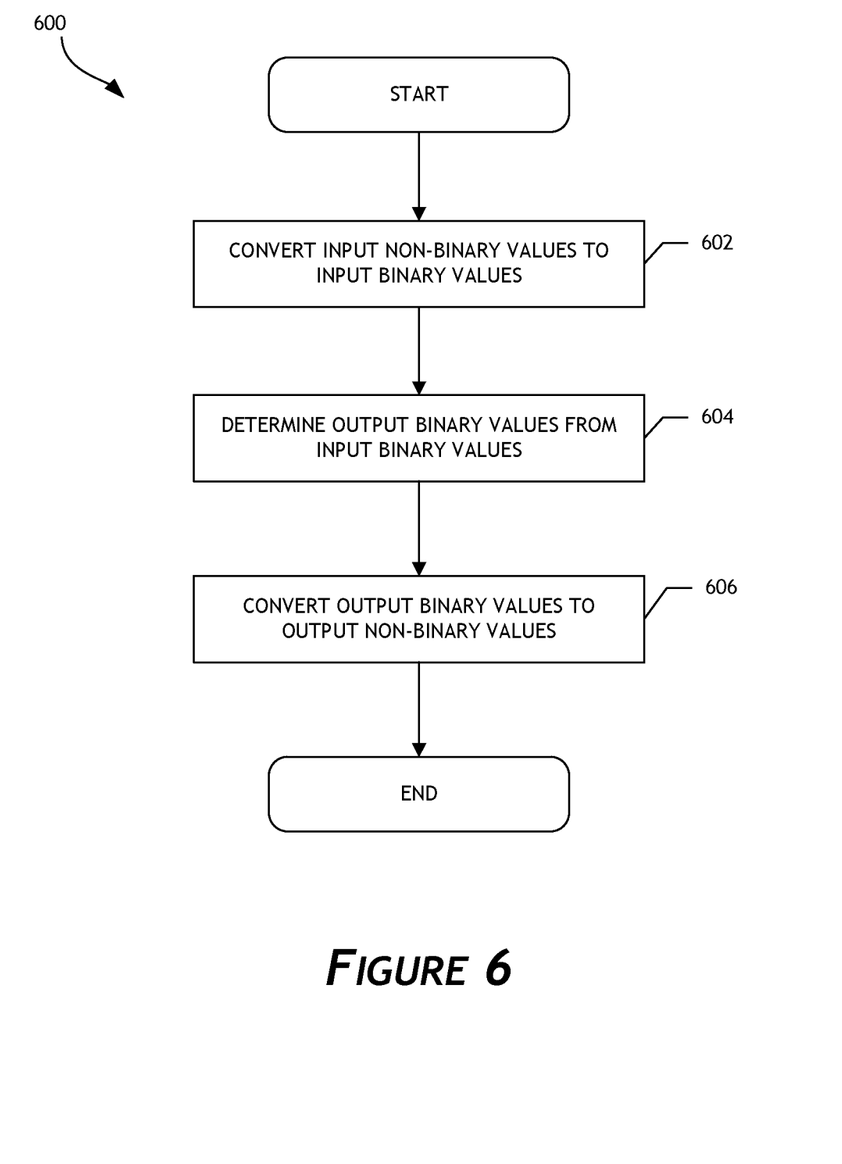
FIG. 6 illustrates a decoding process according to one embodiment of the invention.

FIG. 6 illustrates a decoding process 600 performable by a decoder, such as the decoder module 132 or the decoder 156. For convenience, the process 600 is described in the context of the flow diagram 200, but may instead be implemented using other approaches described herein or other computing approaches not shown. The process 600 provides one example way by which a LDPC decoder can perform non-binary decoding of an LDPC encoded data unit using binary processing. In particular, the process 600 demonstrates how check nodes of a LDPC decoder can be used to process binary values while other nodes (such as variable or permutation nodes) of a LDPC decoder can be used to process non-binary values.

At block 602, the conversion nodes 230A, 230B, 230C can convert input non-binary values to input binary values in accordance with a decomposition algorithm. The input non-binary values can be permuted vectors including LLR values determined based on an LDPC encoded data unit or from a previous decoding iteration. In one example, each of the conversion nodes 230A, 230B, 230C can convert the permuted vectors according to Equations (1), (2), and (3).

At block 604, the binary check nodes 240A, 240B, 240C can perform a binary check node algorithm to determine output binary values from the input binary values. For instance, the binary check nodes 240A, 240B, 240C can respectively perform the binary check node algorithms of Equations (5), (6), and (7).

At block 606, the inverse conversion node 250 can convert the output binary values to output non-binary values in accordance with an inverse decomposition algorithm. The inverse decomposition algorithm can be an inverse algorithm from the decomposition algorithm of block 602. For example, the inverse conversion node 250 can convert the output binary values according to Equations (12), (13), (14), and (15).

Other Variations

Although some embodiments of this disclosure may have been described using data storage systems or controllers for non-volatile storage media as examples, the disclosure can further apply to other environments and applications where data coding may be utilized. For example, the disclosure can apply to technologies where a non-binary LDPC signal can be read from a channel or data source (for example, the data communication channel 154) and then decoded using one or more binary decoders (for example, the decoder 156). In one such example, the disclosure can be used for decoding one or more communication channels in a telecommunications system, for instance, such as a mobile communications system or wireless communications system. Moreover, in some embodiments, statistical or probability metrics can be used in addition to or instead of log likelihood ratios.

The actual steps taken in the disclosed processes, such as the process 600 illustrated in FIG. 6, may differ from those shown herein. Additional system components can further be utilized, and disclosed system components can be combined or omitted. Depending on the embodiment, certain of the steps described above may be removed, others may be added.

Although the flow diagrams and approaches herein may be described in terms of outputting and receiving reliability values, for example, it should be understood that the output and received reliability values may actually be reliability information representing the reliability values output or received. For instance, reliability information itself can include one or more "0" or "1" values that may have no specific meaning when standing alone. However, when understood in a particular context, the one or more "0" or "1" values of the reliability information can represent a particular binary or non-binary value, for example, that may be output or received.

While certain embodiments have been described, these embodiments have been presented by way of example only, and are not intended to limit the scope of the protection. Indeed, the novel methods and systems described herein may be embodied in a variety of other forms. Furthermore, various omissions, substitutions and changes in the form of the methods and systems described herein may be made without departing from the spirit of the protection. For example, the various components illustrated in the figures may be implemented as software and/or firmware on a processor, ASIC/FPGA, or dedicated hardware. Hardware components, such as processors, ASICs, FPGAs, and the like, can include logic circuitry. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure.

What is claimed is:

1. A decoder configured to:
    convert, during each of a plurality of iterations, a plurality of first non-binary values provided at a plurality of variable nodes to input binary values;
    generate, by a plurality of check nodes, output binary values based on the converted input binary values;
    convert the output binary values to second non-binary values for processing by the plurality of variable nodes;
    update, by the plurality of variable nodes, reliability data based on the converted second non-binary values; and
    determine at least a portion of a valid codeword based on the updated reliability data over the plurality of iterations.

2. The decoder of claim 1, wherein a respective variable node of the plurality of variable nodes store a vector of reliability values, the decoder further configured to:
    permute the vector into a plurality of permutations based on at least a portion of a decoding matrix, wherein each permutation is converted to a respective one of the input binary values and distributed among the plurality of check nodes according to a code graph.

3. The decoder of claim 2, wherein each of the input binary values is generated based on a respective permutation and a respective decomposition algorithm corresponding to the respective permutation.

4. The decoder of claim 3, wherein each of the output binary values is generated based on a respective one of the input binary values and a conversion algorithm corresponding to the respective one of the input binary values.

5. The decoder of claim 4, wherein the conversion algorithm functions as an inverse of the decomposition algorithm that corresponds to the respective one of the input binary values.

6. The decoder of claim 5, wherein the decoder is further configured to:
    sort at least a subset of the input binary values;
    compare each sorted input binary value with zero; and
    assign one or more of the sorted input binary value to one or more respective elements of a return vector according to the comparison.

7. The decoder of claim 6, wherein zero is assigned to a largest element of the return vector, a second largest of the input binary values is assigned to a second largest element of the return vector, a third largest of the input binary values is assigned to a third largest element of the return vector, and a result of a function of a third and fourth of the input binary values is assigned to a fourth largest element of the return vector.

8. The decoder of claim 1, wherein the first non-binary values are first vectors and the second non-binary values are second vectors of a same vector size as the first vectors, each of the first and second vectors comprising a number of reliability values according to the same vector size.

9. The decoder of claim 8, wherein the reliability values are log-likelihood ratio values.

10. The decoder of claim 9, wherein the reliability values of each of the first vectors are permutated into three or more respective permutations, converted to three or more corresponding binary permutations, and distributed among three or more corresponding check nodes, and
wherein each of the three or more corresponding check nodes operates on one of the three or more corresponding binary permutations, which are then each converted to vectors in accordance with an inverse decomposition algorithm.

11. A method, comprising:
converting, during each of a plurality of decoding iterations, a plurality of first non-binary values provided at a plurality of variable nodes to input binary values;
generating, by a plurality of check nodes, output binary values based on the converted input binary values;
converting the output binary values to second non-binary values for processing by the plurality of variable nodes;
updating, by the plurality of variable nodes, reliability data based on the converted second non-binary values; and
determining at least a portion of a valid codeword based on the updated reliability data over the plurality of decoding iterations.

12. The method of claim 11, wherein a respective variable node of the plurality of variable nodes comprises a vector of reliability values, the method further comprising:
arranging the vector into a plurality of permutations based on at least a portion of a decoding matrix, wherein each permutation is converted to a respective one of the input binary values and distributed among the plurality of check nodes according to a code graph.

13. The method of claim 12, wherein each of the input binary values is generated based on a respective permutation and a respective decomposition algorithm corresponding to the respective permutation.

14. The method of claim 13, wherein each of the output binary values is generated based on a respective one of the input binary values and a conversion algorithm corresponding to the respective one of the input binary values.

15. The method of claim 14, wherein the conversion algorithm functions as an inverse of the decomposition algorithm that corresponds to the respective one of the input binary values.

16. The method of claim 15, further comprising:
sort at least a subset of the input binary values;
compare each sorted input binary value with zero; and
assign one or more of the sorted input binary value to one or more respective elements of a return vector according to the comparison.

17. The method of claim 16, wherein zero is assigned to a largest element of the return vector, a second largest of the input binary values is assigned to a second largest element of the return vector, a third largest of the input binary values is assigned to a third largest element of the return vector, and a result of a function of a third and fourth of the input binary values is assigned to a fourth largest element of the return vector.

18. The method of claim 11, wherein the first non-binary values are first vectors and the second non-binary values are second vectors of a same vector size as the first vectors, each of the first and second vectors comprising a number of reliability values according to the same vector size.

19. The method of claim 18, wherein the reliability values are log-likelihood ratio values.

20. The method of claim 19, wherein the reliability values of each of the first vectors are permutated into three or more respective permutations, converted to three or more corresponding binary permutations, and distributed among three or more corresponding check nodes, and
wherein each of the three or more corresponding check nodes operates on one of the three or more corresponding binary permutations, which are then each converted to vectors in accordance with an inverse decomposition algorithm.

* * * * *